(12) United States Patent
Takeda et al.

(10) Patent No.: US 6,624,774 B2
(45) Date of Patent: Sep. 23, 2003

(54) DELTA SIGMA D/A CONVERTER

(75) Inventors: Minoru Takeda, Tokyo (JP); Kazuyuki Fujiwara, Tokyo (JP)

(73) Assignee: Nippon Precision Circuits Inc., Tokyo (JP)

( * ) Notice: Subject to any disclaimer, the term of this patent is extended or adjusted under 35 U.S.C. 154(b) by 0 days.

(21) Appl. No.: 09/796,859

(22) Filed: Mar. 1, 2001

(65) Prior Publication Data

US 2003/0016152 A1 Jan. 23, 2003

(30) Foreign Application Priority Data

Mar. 8, 2000 (JP) ........................................ 2000-064022

(51) Int. Cl.[7] ................................................ H03M 1/66
(52) U.S. Cl. ........................................ 341/144; 341/143
(58) Field of Search .................................. 341/143, 144

(56) References Cited

U.S. PATENT DOCUMENTS 6,067,036 A * 5/2000 Mauthe et al. .............. 341/143
6,369,731 B1 * 4/2002 Takeda et al. .............. 341/143
6,515,601 B2 * 2/2003 Fukuhara et al. ........... 341/131

FOREIGN PATENT DOCUMENTS

| JP | 405276048 A | * 10/1993 | ............ H03M/3/02 |
| JP | 407297646 A | * 11/1995 | ............ H03F/1/00 |

* cited by examiner

*Primary Examiner*—Michael Tokar
*Assistant Examiner*—Khai M. Nguyen
(74) *Attorney, Agent, or Firm*—Jordan and Hamburg LLP

(57) ABSTRACT

In a delta sigma type D/A converter, in order to be capable of carrying out muting operation in steps at steps lower than 1 quantized step by digital processing, a multiplexor 2 for selectively outputting a mute code 15 for making an analog signal null and a thermometer code 14 to a local DAC4 is provided between a thermometer code converter 1 and the local DAC4, a time period of 1/M of a sampling period is made to constitute 1 cycle, at m1 ($0 \leq m1 \leq M$) cycle, the thermometer code 14 is made an output of the multiplexor 2 and at other m2 (m2=M−m1) cycle, the mute code 15 is made an output thereof and muting is carried out reducing the m1 cycle or muting is relieved by increasing thereof in steps at respective sampling period.

2 Claims, 13 Drawing Sheets

COMMENT: D=Thermometer-Code Data ; Z=Mute Zero Data(4bit-"1" and 4bit-"0")

DELTA SIGMA D/A CONVERTER

BACKGROUND OF THE INVENTION

Field of the Invention

The present invention relates to a D/A converter of a delta sigma (modulation) type for audio use having high S/N (signal to noise ratio), particularly to a delta sigma D/A converter having an order equal to or higher than a third order and reducing click sound in mute operation and releasing thereof.

With regard to performance of a D/A converter for audio use, there is frequently used a delta sigma (modulation) type capable of realizing comparatively easily desired total harmonic distortion (ratio of harmonic component to signal), S/N (signal to noise ratio) or the like. According to the delta sigma type, by noise shaping technology, there is achieved an advantage capable of converting, for example, a PCM digital signal of 16 bits or more into a low quantized signal of 2 levels (1 bit) through several levels (several bits) and reproducing an analog signal by a local D/A converter (hereinafter, referred to as local DAC) of several levels.

In muting such a delta sigma output, signal processing can not be carried out so simply as in the case of a PCM (Pulse Code Modulation) audio signal. Conventionally, as a muting method of a D/A converter of a delta sigma type, there is provided a system described in Japanese Patent Publication No. 118647/1995 shown by FIG. 11. According to the system, there is provided a mute circuit 11C between a noise shaper (delta sigma converter) 11A comprising a quantizer 11a, adders 11b, 11c, delay circuits 11d, 11e, 11f, and multipliers 11g, 11h, 11i and a local DAC 11B, a state in the noise shaper 11A is determined by an outside circuit, not illustrated, and a quantizer output X is muted by the mute circuit 11C operated by a clock the same as that of the noise shaper 11A. The object of muting operation in the patent is for preventing idling noise outputted from the quantizer from being outputted even in a state in which an audio input signal of the noise shaper is not present. However, even in this system, a step of the quantizer output in the muting operation is 1 quantized step at minimum. When a size of the 1 quantized step is calculated, in the case in which a full swing output of a D/A converter of 2 through 5 bits is set to 5 Vpp (peak-too-prak), there is constituted the quantized step of $5/(2^2)$ through $5/(2^5)=1.25$ through $0.1562$ Vpp. FIG. 12 illustrates in simulation the case in which muting operation is carried out when there is constituted an idling variation of a minimum quantized step (±1 level) in a third order noise shaper output of 24 levels. In the muting operation, the step is generated at minimum.

Therefore, according to other conventional delta sigma D/A converter, as shown by FIG. 13, analog mute is frequently carried out at a mute circuit 11D of electronic volume, transistor or the like at a poststage of the local DAC.

As described above, according to the conventional delta sigma type D/A converter, the step of the quantized output in muting operation is 1 quantized step at minimum. A size of the 1 quantized step is far larger than that of PCM and in order to reduce noise in the muting operation, it is substantially indispensable to carry out analog mute at the poststage of the D/A converter. Therefore, there is increased a deterioration in D/A conversion characteristic by an increase in signal path by the analog mute circuit and an amount of control circuit thereof.

SUMMARY OF THE INVENTION

The present invention dispenses with the analog mute circuit at the poststage by carrying out a processing in digital at a stage of converting 1 quantized step into analog by a local D/A converter and enabling to mute in steps substantially 1 quantized step by a lower step (normally, refereed to as 'soft mute').

According to an aspect of the invention, there is provided a delta sigma D/A converter comprising a noise shaper having a quantizer for generating an output signal having 3 levels or more at a specific sampling period, a thermometer code converter for converting an output signal of the quantizer into a thermometer code of N levels, N pieces of local D/A converters each in correspondence with 1 level of the thermometer code and an analog adder for adding output signals of N pieces of the local D/A converters and generating an analog signal, further comprising a multiplexor for outputting a mute code for making the analog signal null and the thermometer code selectively to the local D/A converters between the thermometer code converter and local D/A converters wherein a time period of 1/M of the sampling period is made to constitute 1 cycle, the thermometer code is made an output of the multiplexor at m1 ($0 \leq m1 \leq M$) cycle and the mute code is made an output of the multiplexor at other m2 (m2=M−m1) cycle and a muting operation is carried out by reducing the m1 cycle or increasing the ml cycle to thereby relieve the muting operation in steps at respective sampling period.

Further, it is preferable that the detail sigma D/A converter includes a shift register having N pieces of registers respectively receiving output signals in correspondence with the respective local D/A converters of the multiplexor and cyclically shifting values of the registers by the cycle wherein an output signal of the multiplexor is provided to the local D/A converters via the shift registers.

BRIEF DESCRIPTION OF THE DRAWINGS

FIG. 4 is a timing chart for explaining operation of the delta sigma D/A converter shown in FIG. 1;

FIG. 8 is a timing chart for explaining operation of the delta sigma D/A converter shown in FIG. 7;

DETAILED DESCRIPTION OF THE PREFERRED EMBODIMENTS

Figure 1:
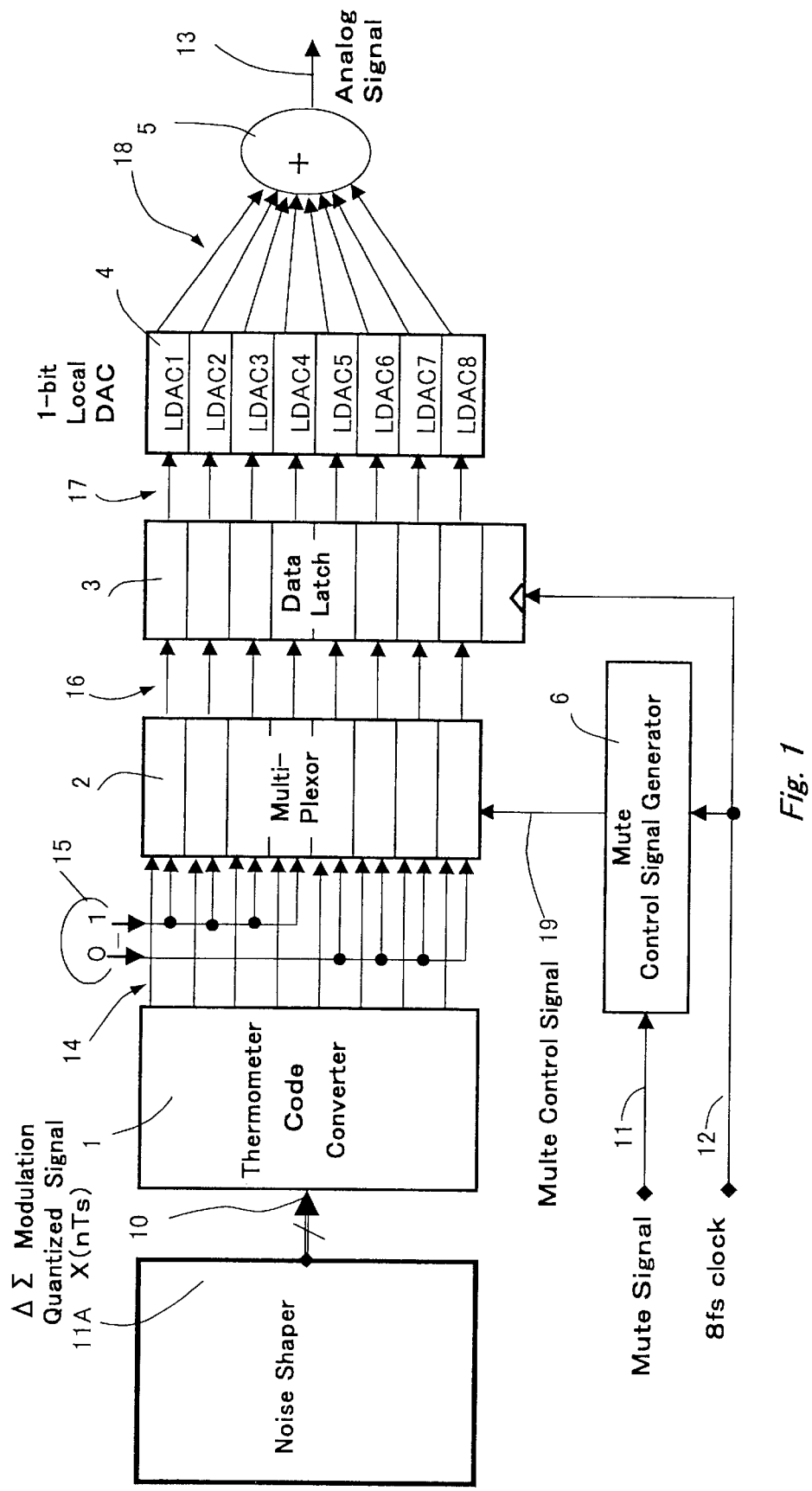
FIG. 1 is a block diagram showing a constitution of a first embodiment of a delta sigma D/A converter according to the invention.
Figure 11:
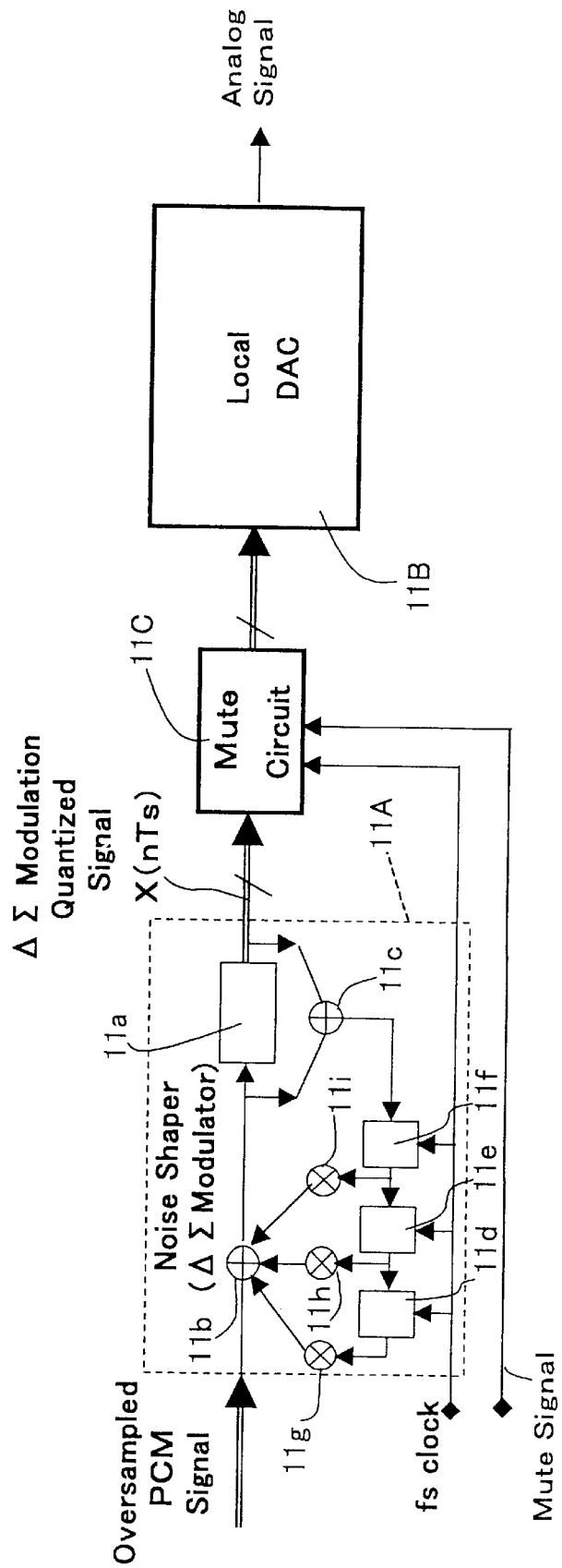
FIG. 11 is a block diagram showing a constitution of a delta sigma D/A converter according to a related art.
Figure 12:
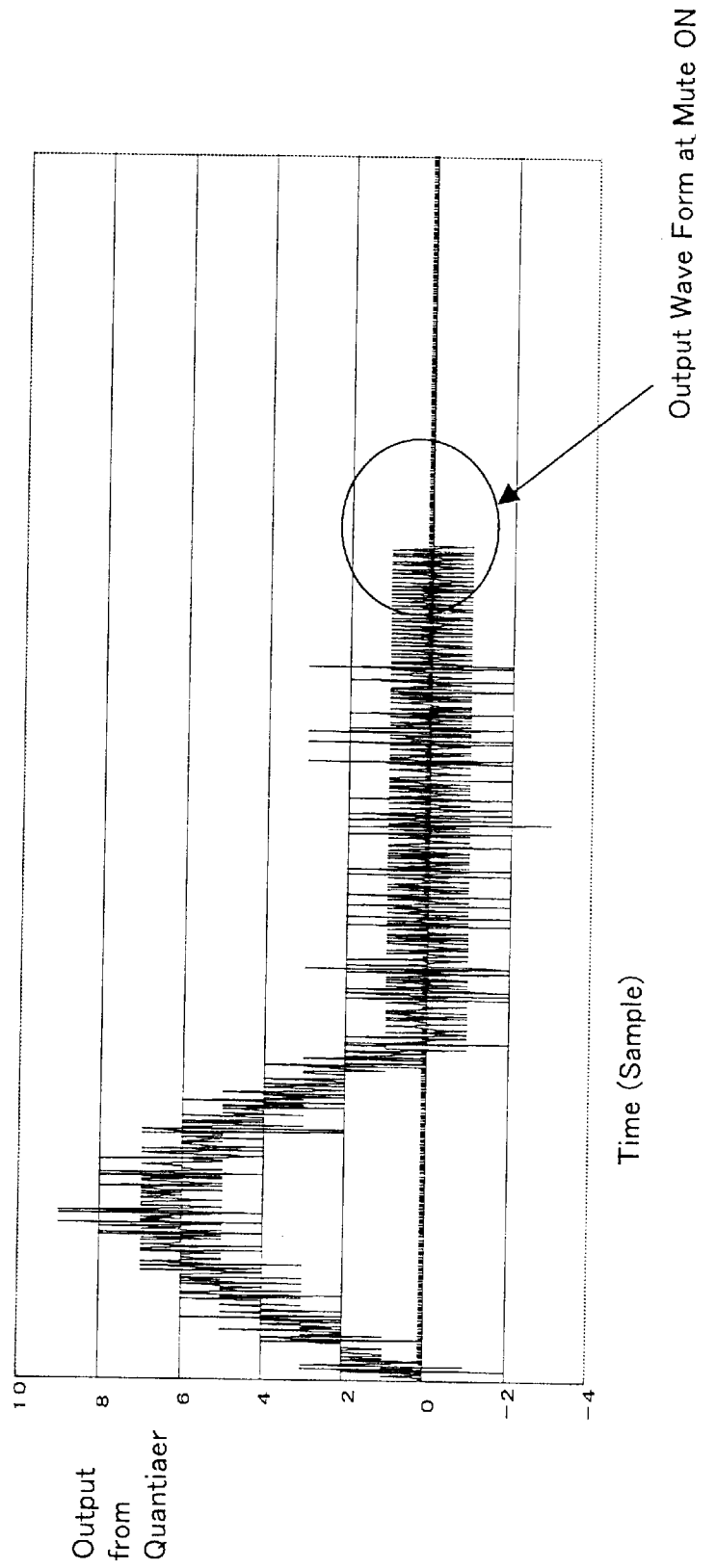
FIG. 12 is a waveform diagram showing an output of a quantizer of the delta sigma D/A converter in FIG. 11.
Figure 13:
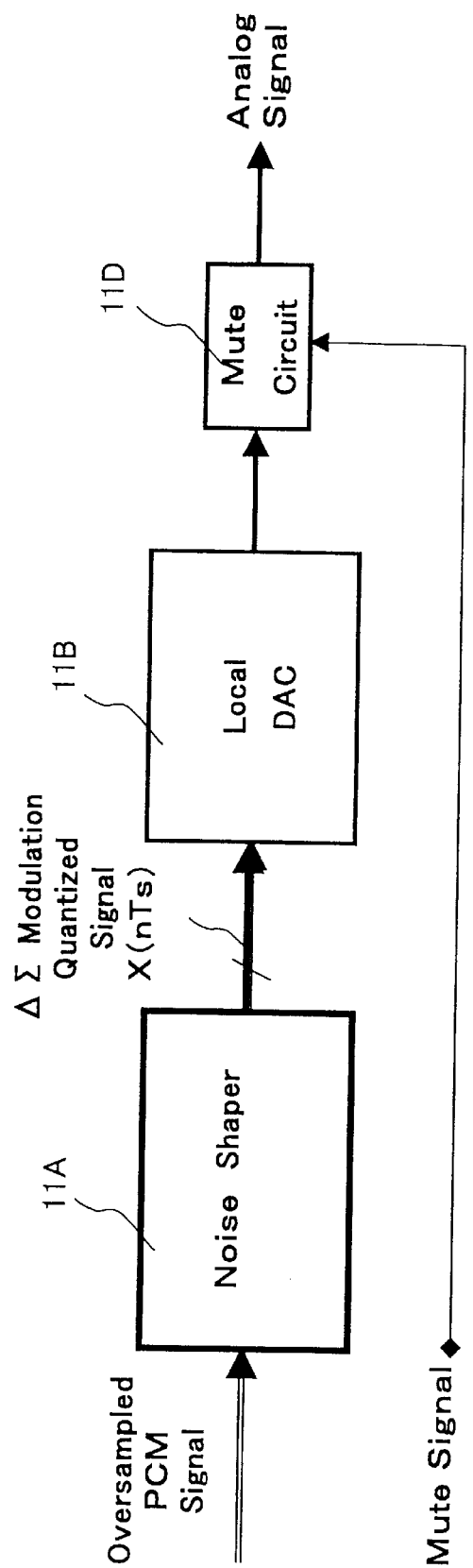
FIG. 13 is a block diagram showing a constitution of a delta sigma D/A converter according to a related art.

A detailed explanation will by given of a delta sigma type D/A converter according to the invention by a first embodiment shown in FIG. 1. The drawing illustrates a delta sigma type D/A converter of 8 levels constituted by a thermometer code converter 1, a multiplexor 2, a data latch 3, 8 pieces of local 1-bit D/A converters (hereinafter, referred to as local DAC) 4, an analog adder 5, a mute control signal generator 6 and a noise shaper 11A. The noise shaper 11A is similar to the conventional constitution shown by FIG. 11. The thermometer code converter 1 receives an output signal of 8 levels (corresponding to 3 bits) from a quantizer of the noise shaper 11A and the quantized signal 10 is converted into 8 levels of thermometer code by a sampling frequency fs. Each of the local DAC 4 corresponds to each bit of the thermometer code and an output signal in correspondence with a logical level of an input signal is generated. The analog adder 5 adds the output signals of 8 pieces of the local DAC 4 and generates an analog signal.

The multiplexor 2 and the data latch 3 are provided between the thermometer code converter 1 and the local DAC 4. The multiplexor 2 is operated by a clock 12 having a frequency fd produced by multiplying the sampling frequency by an integer M (in this case, fd=8·fs) and selectively outputs either 1 input of 2 inputs of a thermometer code 14 outputted from the thermometer code converter 1 and a mute code 15 in correspondence with a thermometer code by which an analog signal becomes null in an audio maner (hereinafter, simply, analog null). The data latch 3 is a data latch of 8 inputs capable of holding data 16 outputted by the multiplexor 2 from the multiplexor 2 at a period of the clock 12. When 1 sampling period is divided into M (here, M=8) cycles and the M cycles are divided in 2, and one of them is set to m1 cycle, other thereof is set to m2 cycle (m1+m2=M), the multiplexor 2 selects the thermometer code 14 at m1 cycle and selects the mute code 15 at m2 cycle in accordance with a mute control signal, mentioned later. The mute control signal generator 6 generates the mute control signal for successively monotonously increasing and decreasing m1 cycle and m2 cycle at respective sampling periods in accordance with an outside mute signal 19 based on the clock of the frequency fd.

According to an 8 level quantizer of the noise shaper 11A, a central level of 0 through 8 levels is 4 level and the level corresponds to analog null in an alternating current (AC) audio signal. Hence, according to the mute code 15, 4 bits in 8 bits of the thermometer code is '1' and other 4 bits is '0'. Therefore, in 2 inputs of the multiplexor, with regard to the input which is not the thermometer code, 4 terminals are connected to '1' and other 4 terminals are connected to '0'.

Figure 2:
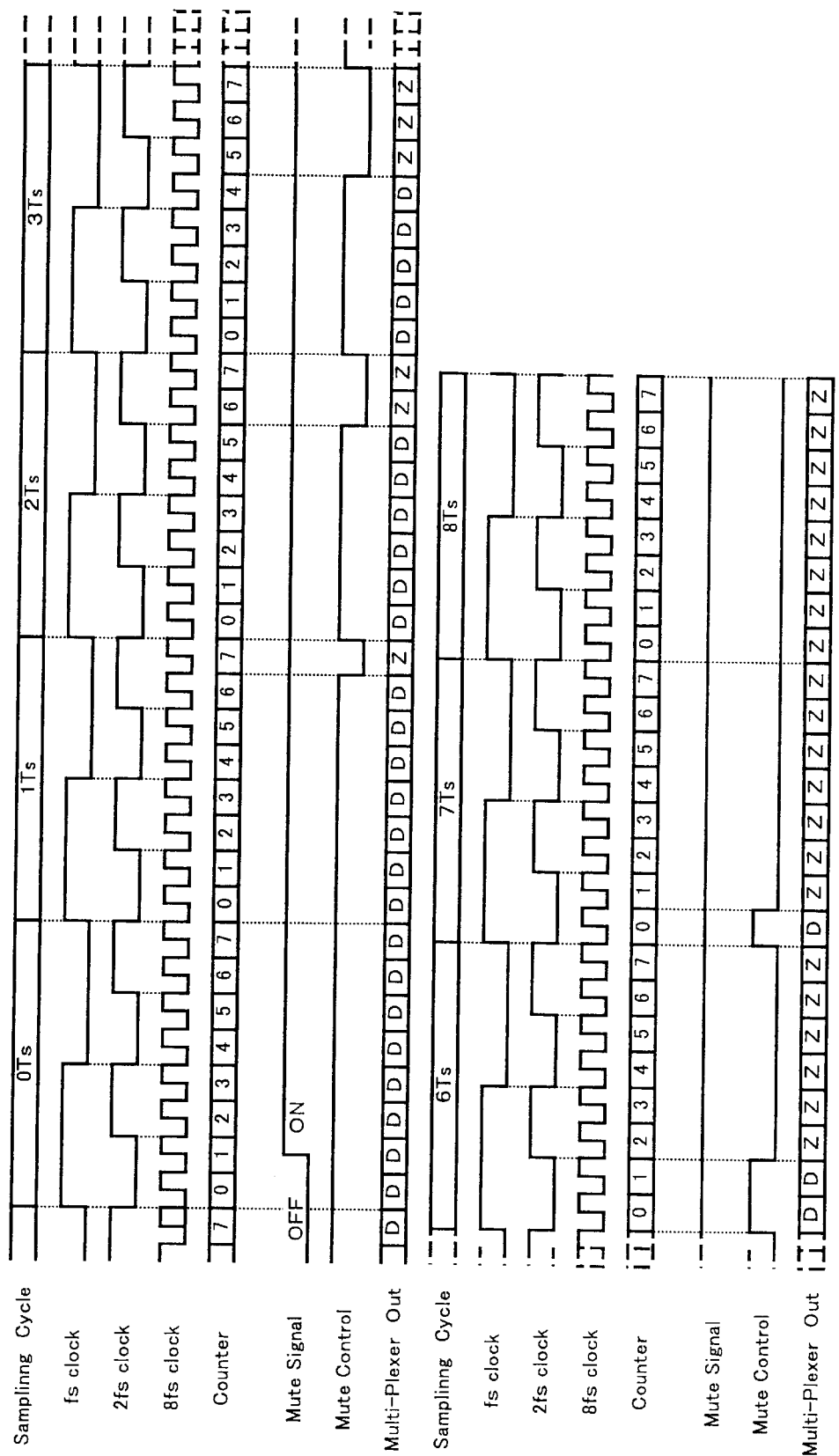
FIG. 2 is a timing chart for explaining operation of the delta sigma D/A converter shown in FIG. 1.
Figure 3:
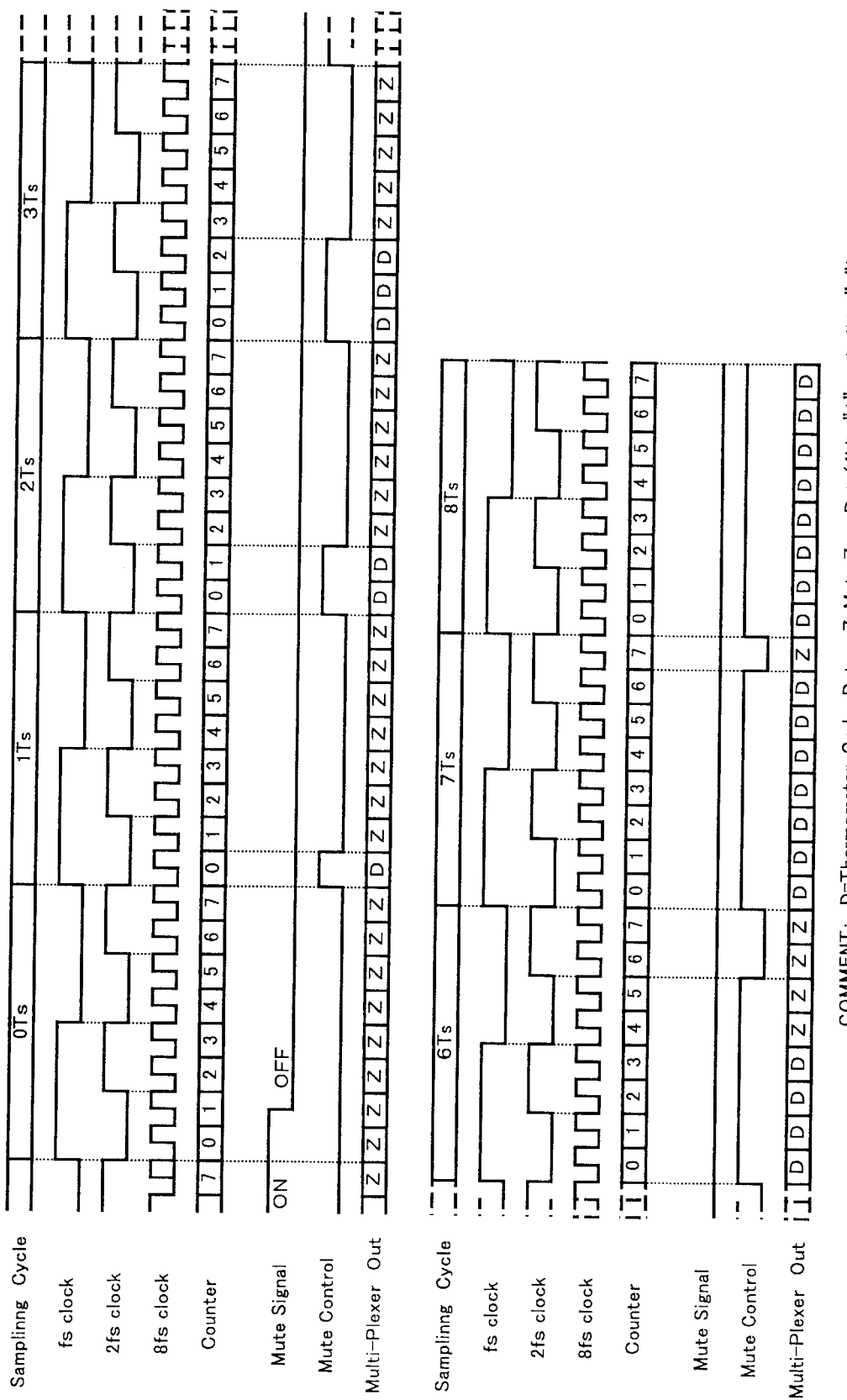
FIG. 3 is a timing chart for explaining operation of the delta sigma D/A converter shown in FIG. 1.

Next, an explanation will be given of operation of the example in reference to the timing charts of FIG. 2 through FIG. 6. FIG. 2 shows operation of the example in mute ON control. Further, FIG. 3 shows operation of the example in mute OFF control. In FIG. 2 and FIG. 3, notations Sampling Cycle, fs clock, 2 fs clock, 8 fs clock, Counter, Mute Signal, Mute Control Multi-Plexor Out, respectively designate sampling period (cycle), sampling frequency fs clock, 2 fs clock, 8 fs clock, a value of an 8 cycle counter by 8 fs clock (internal counter code of the mute control signal generator 6), outside mute signal, mute control signal, multiplexor output data.

First, in mute On control, as shown by FIG. 2, when at sampling period 0TS, the outside mute signal is switched from OFF to ON, the mute control signal generator 6 increases '0' section of the mute control signal in steps at each sampling period Ts up to sampling period 8Ts in accordance with 8 fs clock. That is, the mute control signal becomes 0 by the internal counter code 7 of the mute control signal generator 6 at the sampling period 1Ts. Similarly, at the sampling period 2Ts, 3Ts . . . , 6Ts, 7Ts, 8Ts, the mute control signal becomes '0' respectively by counter code 6 through 7, 5 through 8 . . . , 2 through 7, 1 through 7, 0 through 7. The multiplexor 2 selectively outputs the thermometer code D (designated by D for convenience in FIGS. 2 and 3) when the mute control signal is '1' and selectively outputs a mute code Z (designated by Z for convenience in FIGS. 2 and 3) in correspondence with analog null when the mute control signal is '0' and m2 cycle at which the output of the multiplexor 2 becomes the mute code Z, is increased in steps.

Contrary to the mute ON control state, in carrying out mute OFF control, as shown by FIG. 3, at the sampling period 0Ts, the outside mute signal is switched from ON to OFF, at counter code 0 of next sampling period 1Ts, the mute control signal is switched to '1' and '1' section of the mute control signal in steps up to sampling period 8Ts is increased. That is, at counter code 0 of sampling period 1Ts, the mute control signal becomes '1', as a result, the output of the multiplexor 2 becomes the thermometer code D. Similarly, at sampling period 2Ts, 3Ts, . . . 6Ts, 7Ts, 8Ts, the mute control signal becomes '1' respectively at the counter code 0 through 1, 0 through 2, . . . 0 through 5, 0 through 6, 0 through 7.

Figure 4:
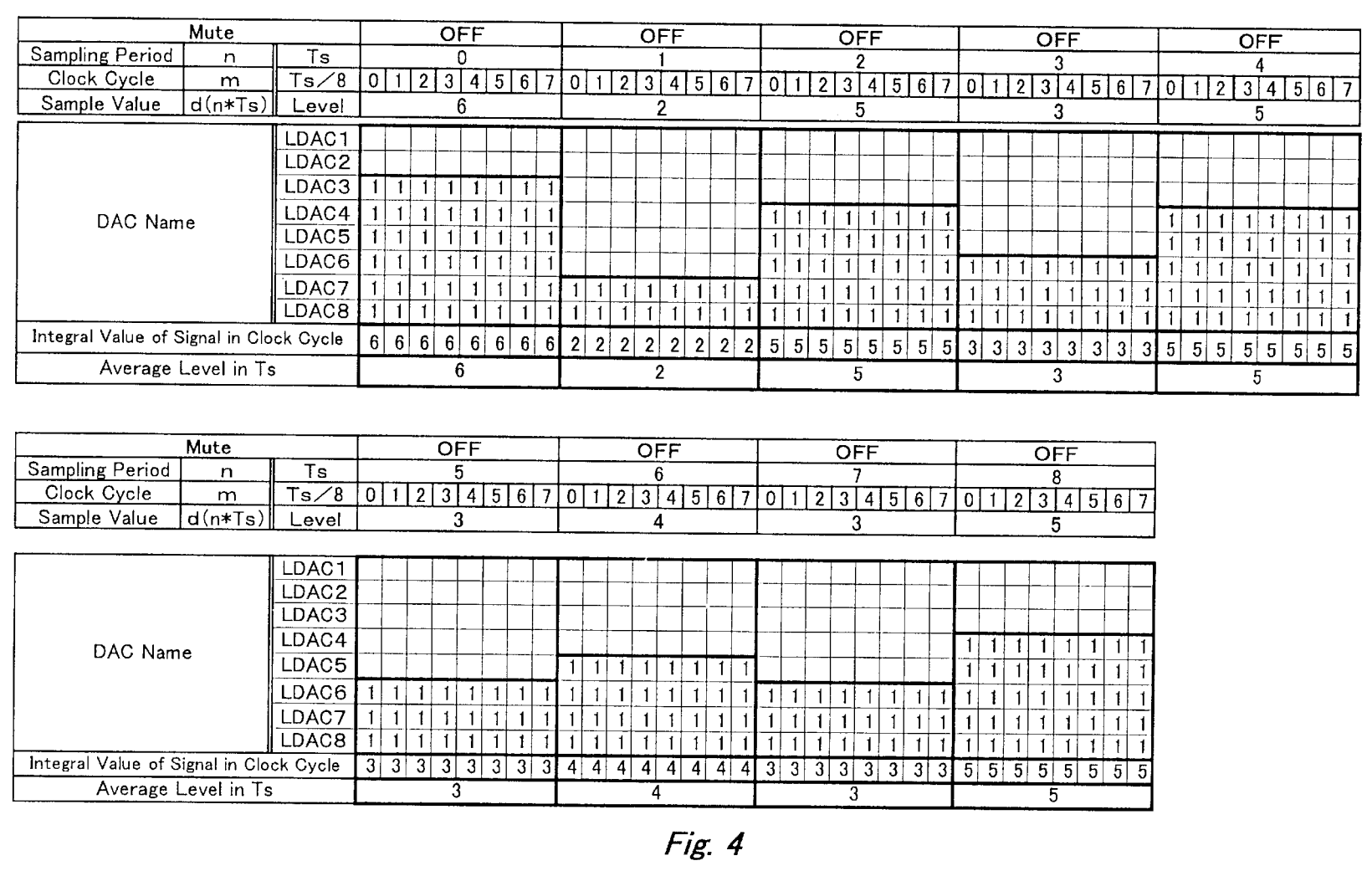

The timing chart of FIG. 4 shows operation of local DAC in normal time other than mute ON, OFF control time according to the example. In the drawing, there is shown an output state of local DAC 4 (in the drawing, respective local DAC 4 is designated as LAD1 through LAD8 and also in FIG. 5 and FIG. 6, mentioned later, similarly shown) in the case in which the level (shown as sample value in the drawing, also in FIG. 5 and FIG. 6, mentioned later, similarly shown) of the thermometer code among 9 sampling periods from sampling period 0Ts to sampling period 8Ts, is 6, 2, 5, 3, 5, 3, 4, 3, 5. In normal time, the thermometer code is inputted to local DAC by the same code in 1 sampling period, in other words, a total time period of 8 fd clock (periods designated by counter code 0, 1, 2, 3, 4, 5, 6, 7 of FIG. 4).

Figure 5:
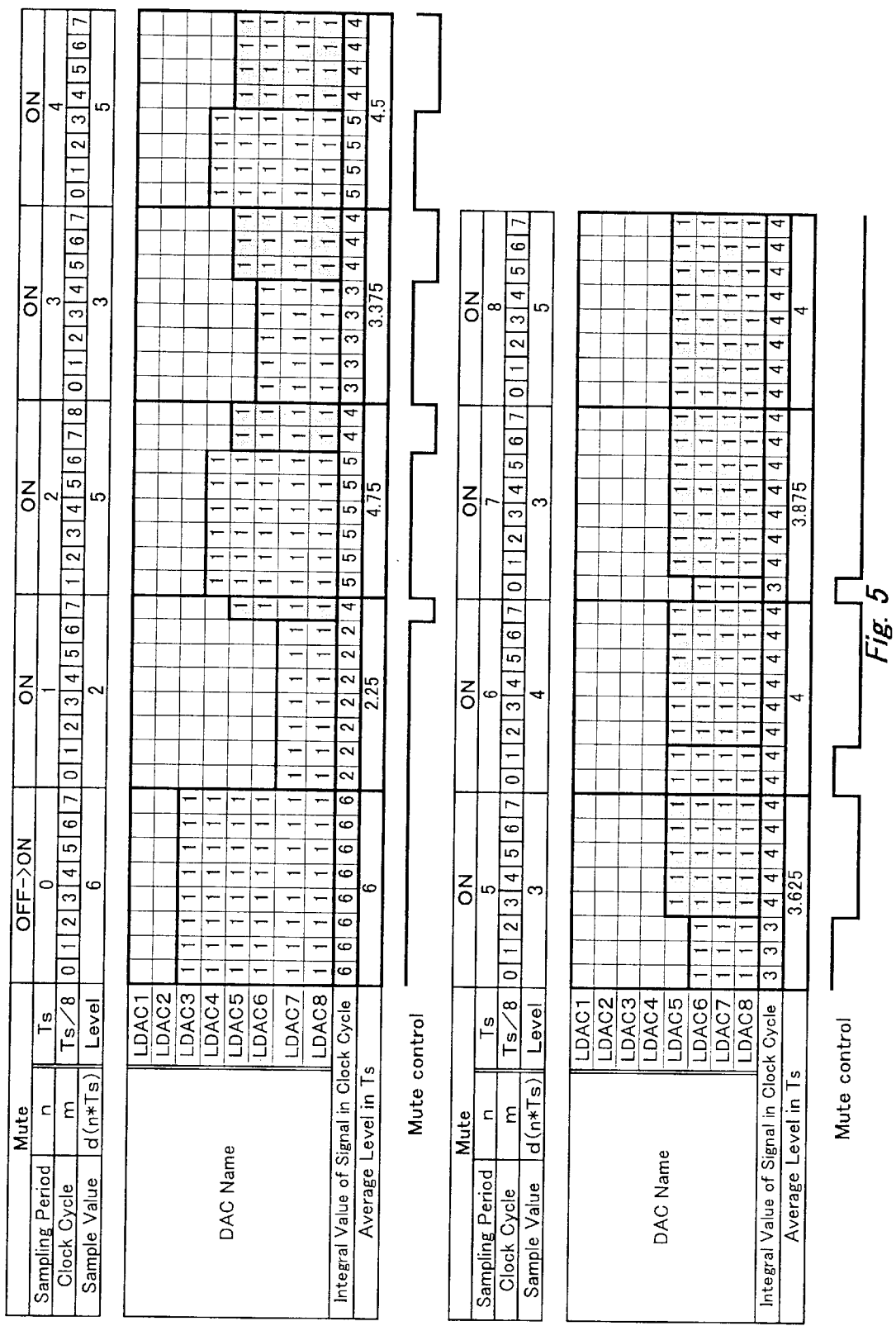
FIG. 5 is a timing chart for explaining operation of the delta sigma D/A converter shown in FIG. 1.

The timing chart of FIG. 5 shows operation of local DAC in mute ON control in the example. An explanation is given of a control method of local DAC by mute control signal in steps up to sampling period 8Ts when the outside mute signal is switched from OFF to ON at sampling period 0Ts. The operation corresponds to operation shown in FIG. 2 and the operation is carried out in accordance with the mute control signal generated at respective timings of FIG. 2. At the counter code 7 of 1Ts period, the mute control signal becomes '0' and the multiplexor output becomes Z. As a result, the mute control signal becomes '0' respectively at the counter code 6 through 7, 5 through 8, . . . 2 through 7, 1 through 7, 0 through 7 in sampling period 2Ts, 3Ts, . . . 6Ts, 7Ts, 8Ts. The thermometer code is inputted to 8 pieces of the local DAC 4 while being latched to the data latch 3 by 8 fs clock. When the mute control becomes '0', the mute code ('1' of 4 bits and '0' of 4 bits) is inputted to local DAC 4. FIG. 5 (and FIG. 6, mentioned later) show a state in which the mute code is inputted to local DAC 4 by netting. As a result of the control, in the time period from sampling period 1Ts to sampling period 8Ts, software can be muted.

Figure 6:
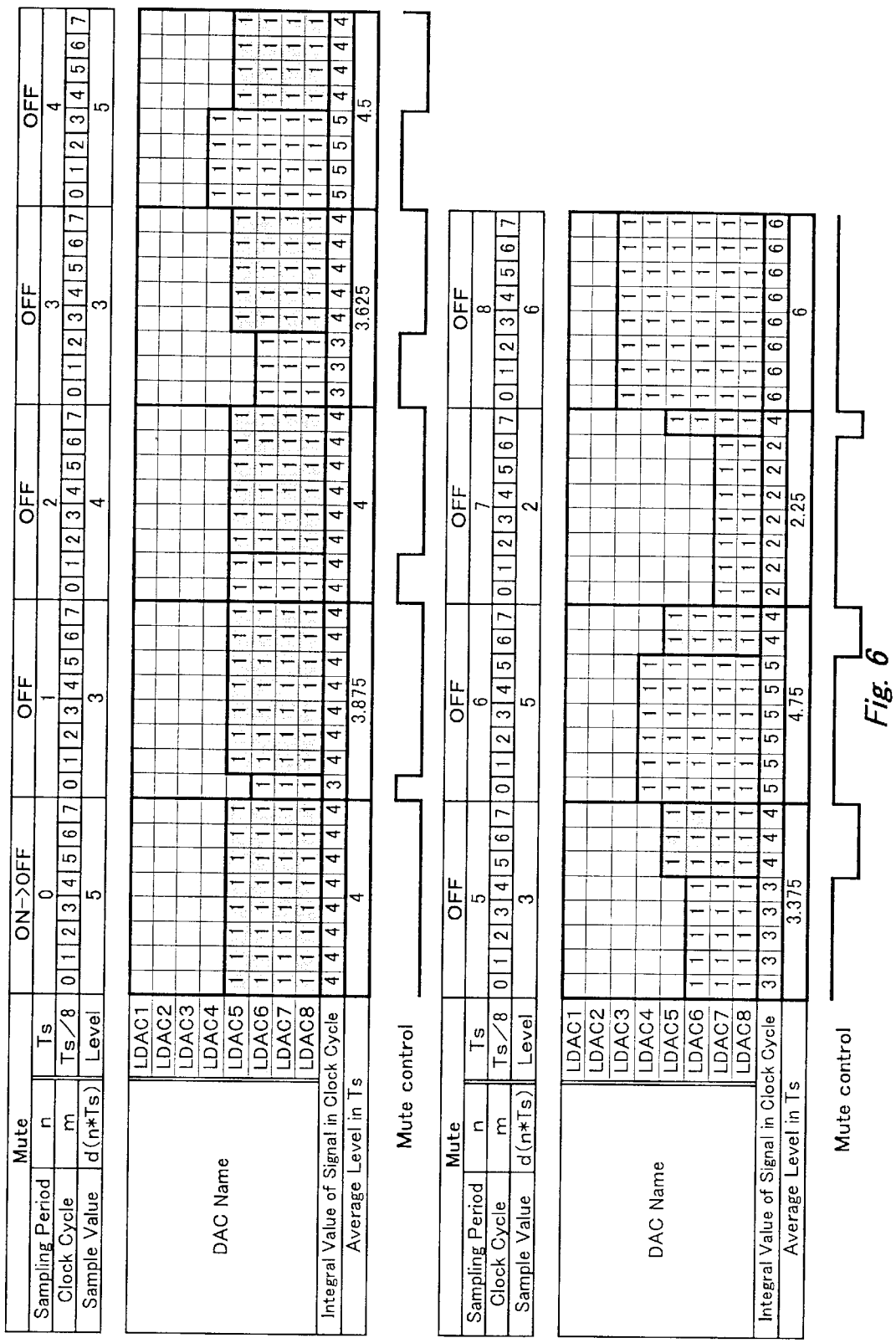
FIG. 6 is a timing chart for explaining operation of the delta sigma D/A converter shown in FIG. 1.

The timing chart of FIG. 6 shows operation of local DAC in mute OFF time in the example. An explanation is given here of the control method of local DAC by the mute control signal in steps up to sampling period 8Ts when at a sampling period 0Ts, the outside mute signal is switched from ON to OFF. The operation corresponds to operation shown in FIG. 3 and the operation is carried out in accordance with the mute control signal generated at respective timings of FIG. 3. At a counter code 0 of 1Ts period, the mute control signal becomes '1' and the multiplexor output becomes D. As a result, the mute control signal becomes '1' respectively at counter code 0 through 1, 0 through 2, . . . 0 through 5, 0 through 6, 0 through 7 in sampling period 2Ts, 3Ts, . . . 6Ts, 7Ts, 8Ts. The thermometer code is inputted to 8 pieces of the local DAC 4 while being latched to the data latch 3 by 8 fs clock. When the mute control signal becomes '1', the thermometer code is inputted to local DAC. As a result of the control, the mute can be relieved softly at time period of from sampling period 1Ts to sampling period 8Ts.

As described above, according to the example, when 1/M of the sampling period constitutes 1 cycle, at m1 ($0 \leq m1 \leq M$) cycle, the thermometer code is inputted to local DAC and at other m2 (m2=M−m1) cycle, the mute code is inputted to local DAC to thereby carry out D/A conversion, in the mute ON control, at respective sampling periods, m1 cycle is reduced in steps from M cycle to 0 cycle to thereby carry out mute and in the mute OFF control, at respective sampling periods, m1 cycle is increased from 0 cycle to M cycle in steps to thereby relieve mute. Therefore, as shown by average levels in Ts periods of FIG. 5 and FIG. 6, mute can be carried out or can be relieved in steps by steps substantially lower than 1 quantized step at respective sampling periods and click noise can be reduced. Accordingly, muting at an analog stage for removing click noise is dispensed with. Therefore, there can be reduced a deterioration in the D/A conversion characteristic by increase in signal path by mute circuit having the analog constitution at the poststage of the delta sigma D/A converter and the amount of control circuit in accordance therewith.

Figure 7:
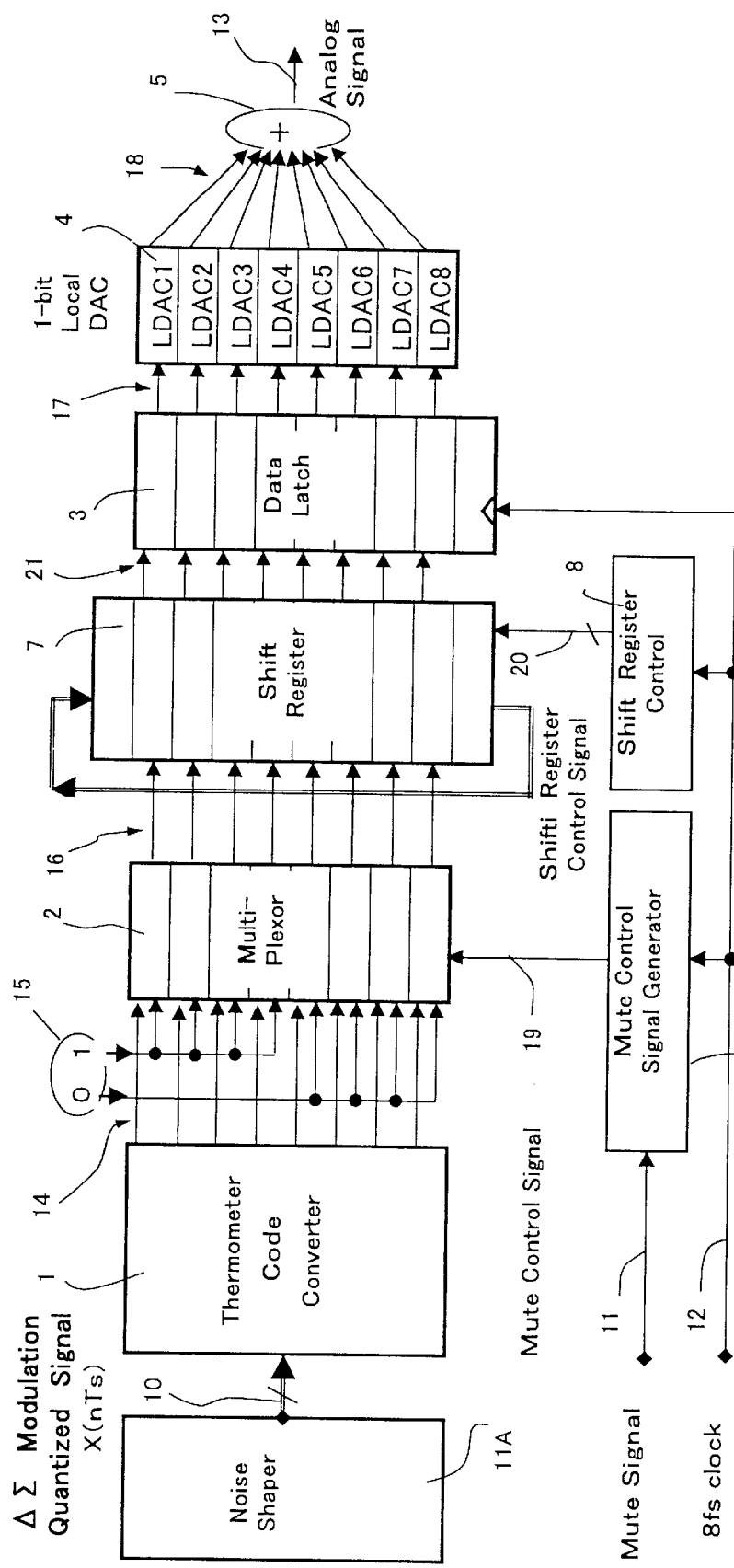
FIG. 7 is a block diagram showing a constitution of a second embodiment of a delta sigma D/A converter according to the invention.

Next, an explanation will be given of a second embodiment of a digital sigma type D/A converter according to the invention in reference to FIG. 7. In FIG. 7, notations the same as those shown in FIG. 1 designate the same constituent elements. According to the example, there are provided a shift register 7 for receiving respective multiplexor outputs 16 at respective registers and a shift register controller 8 for shifting stored values of the respective registers of the shift register 7 by the clock of the frequency fd and the output of the shift register 7 is inputted to the data latch 3. By the operation of the shift register 7, there can be prevented a deterioration in DAC performance caused by a dispersion in local DAC which must be provided with the same characteristic inherently. The system is referred to as dynamic element matching (DEM) system. According to the example, as an example thereof, comparatively simple DEM system is combined with the invention. Although there are other various systems in the DEM system, here, it is shown that the basic muting method shown in FIG. 1 can be used along with the DEM system.

Figure 8:
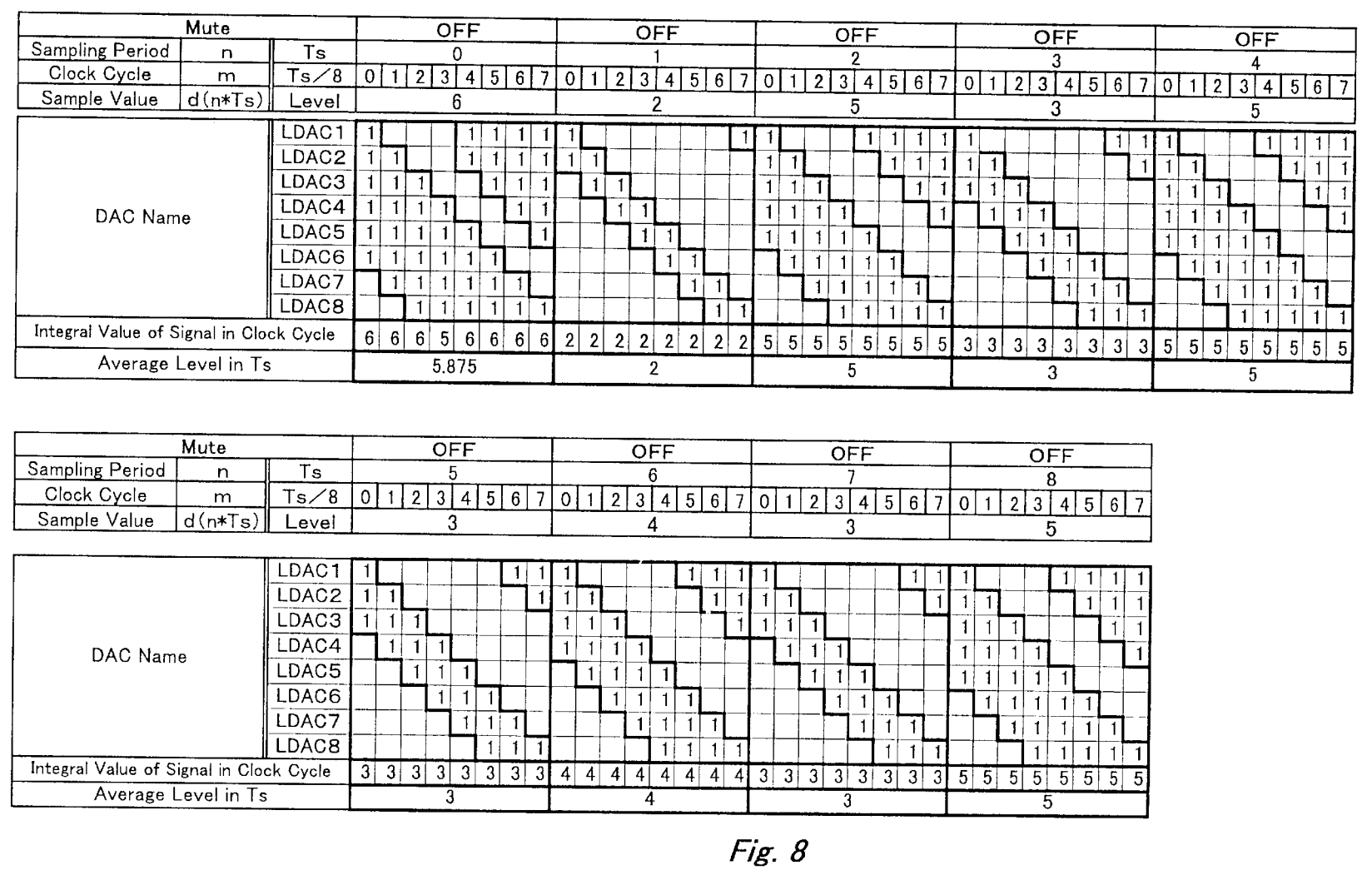
Figure 9:
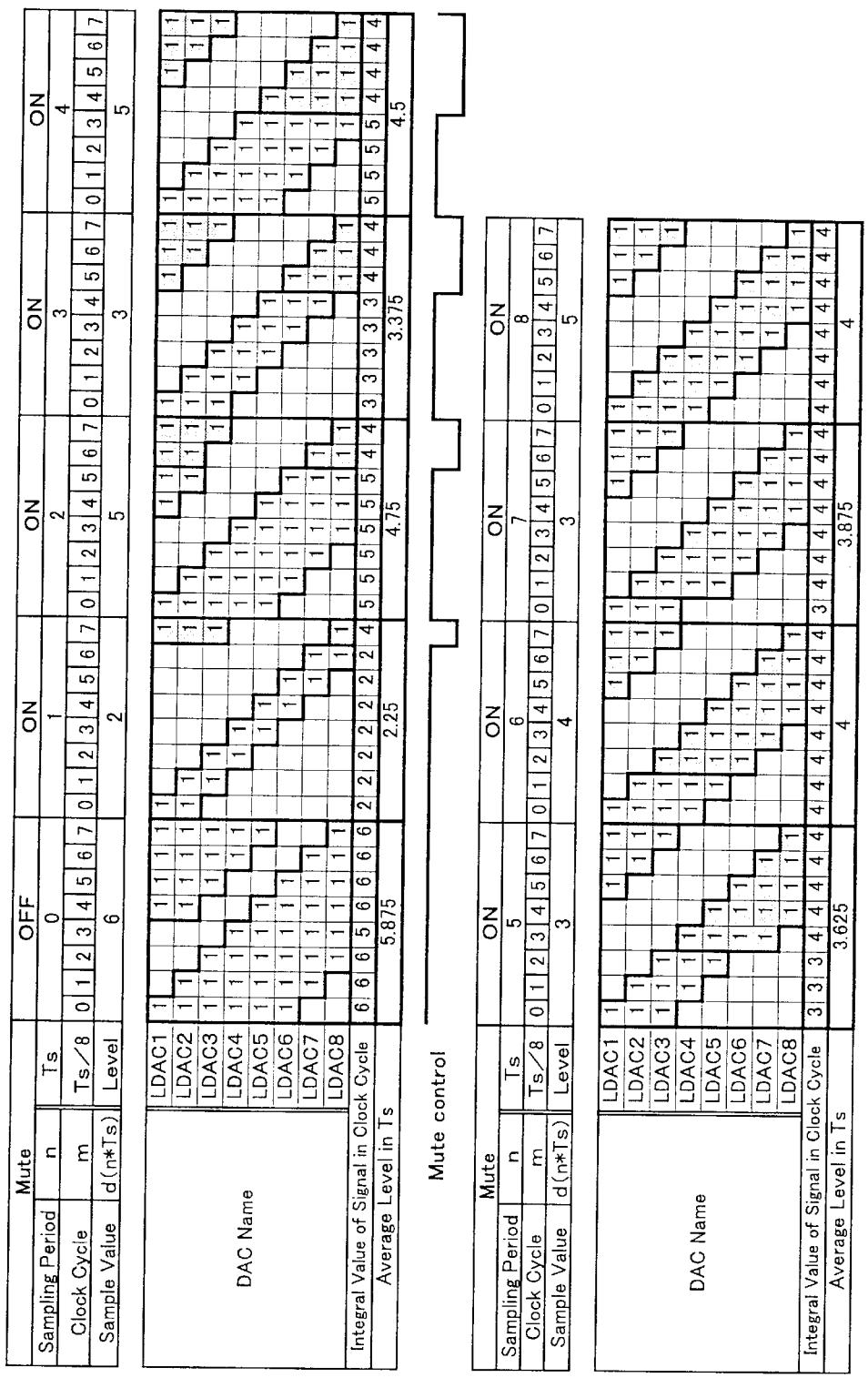
FIG. 9 is a timing chart for explaining operation of the delta sigma D/A converter shown in FIG. 7.
Figure 10:
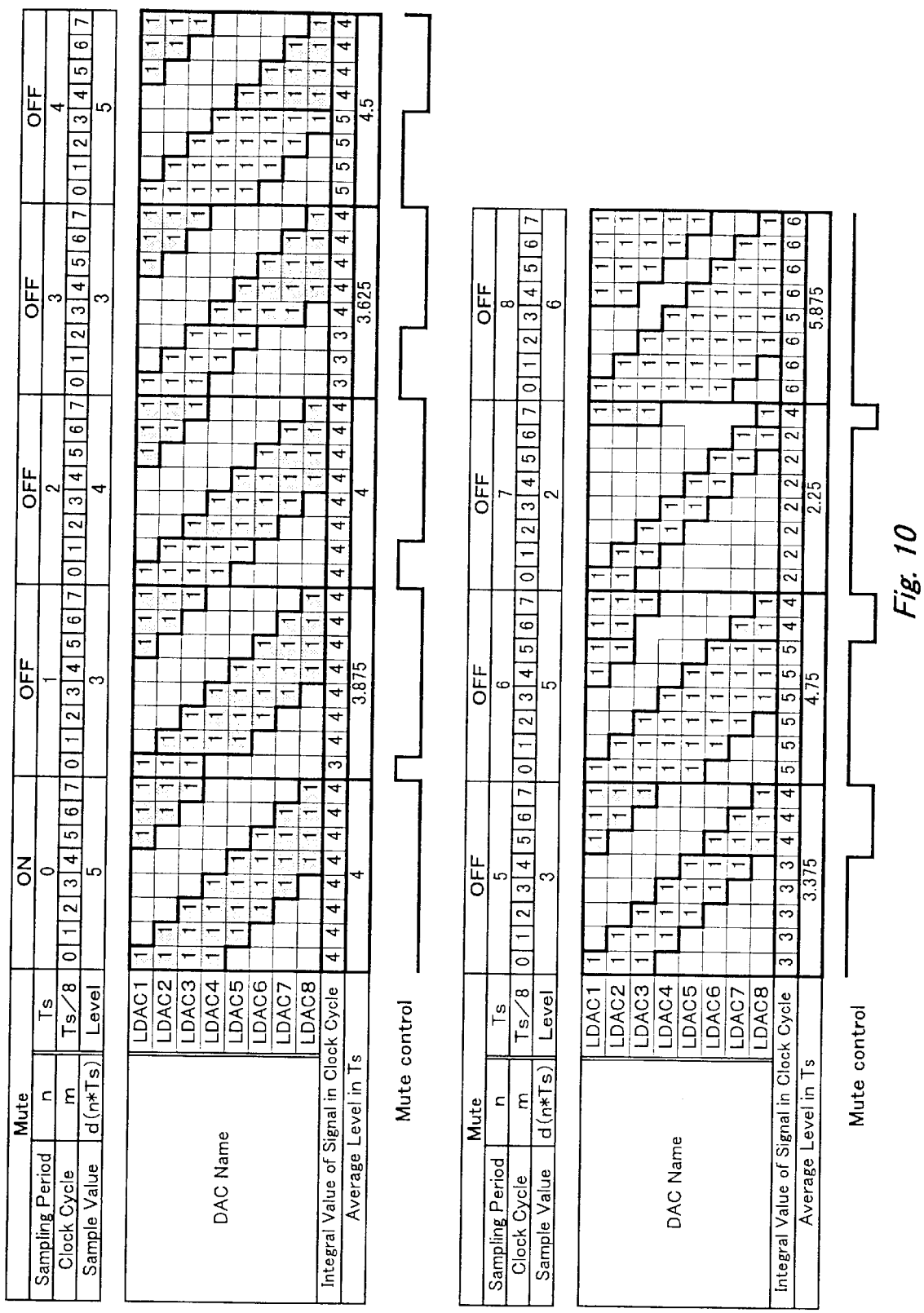
FIG. 10 is a timing chart for explaining operation of the delta sigma D/A converter shown in FIG. 7.

Next, a simple description will be given of operation of the example in reference to timing charts of FIG. 8 through FIG. 10 in correspondence with FIG. 4 through FIG. 6 in the above-described embodiment. FIG. 8 shows operation of local DAC in normal time example. Further, FIG. 9 shows operation of local DAC in mute ON control in the example. FIG. 10 shows operation of local DAC in mute OFF control of the example. Data shown by netting in the respective drawings are mute code. These operations are achieved by inputting the output 16 of the multiplexor 2 to the shift register 7 and shifting thereof successively by an amount of 1 local DAC by fd clock in addition to operation of the above-described embodiment.

According to the example, not only operation and effect of the above-described embodiment are achieved but also a deterioration in DAC performance by dispersion in local DAC can be prevented.

Further, according to the invention, idling noise generated by the noise shaper in no signal time at the delta sigma D/A converter can be eliminated by using the mute code. For example, when there is constructed a constitution in which the mute ON control is started by detecting no signal state of input to the delta sigma D/A converter, idling noise hereinafter can be hampered without stopping the noise shaper.

According to the invention, by the digital processing, 1 quantized step can be muted in steps and click noise can be reduced. Accordingly, mute at an analog stage for removing click noise is dispensed with. Thereby, it is not necessary to carry out mute countermeasure at an analog stage as in the related art and accordingly, there can be reduced the deterioration in the D/A conversion characteristic by increase in signal path by the mute circuit at the poststage of the delta sigma D/A converter and the amount of control circuit in accordance therewith.

Further, idling noise generated by the noise shaper in no signal time of the delta sigma D/A converter can be eliminated by using mute code.

What is claims is:

1. A delta sigma D/A converter comprising:
    a noise shaper having a quantizer for generating an output signal having 3 levels or more at a specific sampling period;
    a thermometer code converter for converting an output signal of the quantizer into a thermometer code of N levels;
    N pieces of local D/A converters each in correspondence with 1 level of the thermometer code; and
    an analog adder for adding output signals of N pieces of the local D/A converters and generating an analog signal, further comprising:
        a multiplexor for outputting a mute code for making the analog signal null and the thermometer code selectively to the local D/A converters between the thermometer code converter and local D/A converters;
        wherein a time period of 1/M of the sampling period is made to constitute 1 cycle, the thermometer code is made an output of the multiplexor at m1 ($0 \leq m1 \leq M$) cycle and the mute code is made an output of the multiplexor at other m2 (m2=M−m1) cycle and a muting operation is carried out by reducing the m1 cycle or increasing the m1 cycle to thereby relieve the muting operation in steps at respective sampling period.

2. The delta sigma D/A converter according to claim 1, further comprising:
    a shift register having N pieces of registers respectively receiving output signals in correspondence with the respective local D/A converters of the multiplexor and cyclically shifting values of the registers by the cycle;
    wherein an output signal of the multiplexor is provided to the local D/A converters via the shift registers.

* * * * *